United States Patent
U'Ren

(10) Patent No.: US 6,580,104 B1
(45) Date of Patent: Jun. 17, 2003

(54) ELIMINATION OF CONTAMINANTS PRIOR TO EPITAXY AND RELATED STRUCTURE

(75) Inventor: Gregory D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/114,749

(22) Filed: Apr. 1, 2002

Related U.S. Application Data

(62) Division of application No. 09/667,660, filed on Sep. 22, 2000.

(51) Int. Cl.[7] .............................................. H01L 27/10
(52) U.S. Cl. ........................ 257/205; 257/206; 438/312; 438/320
(58) Field of Search ................................ 257/336, 344, 257/205; 438/320–318, 312, 758, 680

(56) References Cited

U.S. PATENT DOCUMENTS 6,251,738 B1 * 6/2001 Huang ........................ 438/312
6,342,453 B1 * 1/2002 Kandan et al. ............. 438/758

* cited by examiner

*Primary Examiner*—David Nelms
*Assistant Examiner*—D Le
(74) *Attorney, Agent, or Firm*—Farjami & Farjami LLP

(57) ABSTRACT

According to the disclosed method, the surface of a semiconductor wafer is covered by a protective oxide. The semiconductor wafer is then placed in a CVD reactor at a first temperature. Contaminants and the protective oxide are then removed from the surface of the semiconductor wafer at the first temperature. While contaminants and the protective oxide are being removed by the action of HCl and DCS, any silicon being removed from the surface of the silicon wafer, is being replenished so that there is no net change in the amount of silicon on the surface of the water. After removal of the contaminants and the protective oxide, epitaxial growth is performed on the surface of the semiconductor wafer at the first temperature. A structure comprising an epitaxially grown region can be fabricated according to the disclosed method.

24 Claims, 4 Drawing Sheets

ELIMINATION OF CONTAMINANTS PRIOR TO EPITAXY AND RELATED STRUCTURE

This is a divisional of application Ser. No. 09/667,660 filed Sep. 22, 2000.

BACKGROUND OF THE INVENTION

1. Field of the Invention

The present invention relates to the field of fabrication of semiconductor devices. More specifically, the invention relates to epitaxial growth in fabrication of silicon-germanium (SiGe) semiconductor devices.

2. Background Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been achieved for the SiGe HBT, which are comparable to more expensive GaAs and other devices. Previously, silicon-only devices have not been competitive for use where high speed and frequency response are required.

The higher gain, speeds, and frequency response of the SiGe HBT have been achieved as a result of certain advantages of silicon-germanium not available with pure silicon, for example, narrower band gap, and reduced resistivity. Silicon-germanium may be epitaxially grown on a silicon substrate using conventional silicon processing and tools. This technique allows one to engineer device properties such as the energy band structure and carrier mobility. For example, it is known in the art that grading the concentration of germanium in the silicon-germanium base builds into the HBT device an electric field or potential gradient, which accelerates the carriers across the base, thereby increasing the speed of the HBT device compared to a silicon-only device. A common method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer as well as precise control over the doping profile. As already noted, speeds in the range of approximately 100 GHz have been demonstrated for silicon-germanium devices, such as the HBT.

Epitaxial growth of silicon-germanium on a silicon surface that is sufficiently high quality to meet the demands of fabrication for devices such as the HBT demands that the silicon surface be as near as possible to a perfect crystal surface. Specifically, the silicon surface must not be contaminated and must be free from surface irregularities, which include pits or hillocks. The presence of contaminants and surface irregularities on the silicon surface has the deleterious effect on the subsequent epitaxy of silicon-germanium so as to compromise the crystalline lattice perfection of the silicon-germanium layer, which therefore can negate the benefit of epitaxy. For example, physical contaminants on the initial or starting silicon surface will result in defective epitaxial material in the form of planar crystalline defects. Pits can be formed, for example, in the process of removing silicon oxide contaminants as further discussed below.

The epitaxy of silicon-germanium integrates two dissimilar materials. The benefit of this integration is the tailoring of electronic band structure so as to build a high-performance SiGe HBT device. The drawback is the development of strain between the two materials, which imposes practical limits on device design, i.e. thickness and germanium concentration. The stability and overall perfection of the strained layers depends on the condition of starting silicon surface, since imperfections, regardless of origin, act as heterogeneous nucleation sites increasing the potential defectivity of the epitaxial silicon-germanium layer. Increasing strain either by increasing thickness or germanium concentration of the layer puts stricter acceptable limits for surface imperfections or irregularities.

The presence of contaminants and surface irregularities on the silicon surface can adversely affect yield of the fabrication process, device performance, or device reliability. For example, defects due to contamination may cause the wafer to fail quality checks and inspections within the fabrication process resulting in fewer wafers completing the fabrication process and higher costs due to lower yield. Device performance can be changed, for example, by unwanted mobile ionic contaminants resulting in a device unsuitable for the use for which it was designed. Device reliability can be adversely affected, for example, by small amounts of metallic contaminants which can travel in the device and eventually cause failure. Therefore, it is important to control the presence of contaminants and surface irregularities on the silicon surface in order to prevent adverse effects on yield, performance, and reliability of silicon-germanium devices.

Contaminants, which must be removed from the silicon surface, include particulate matter, organic residue, and inorganic residue. By way of example, particulate matter includes dust and smoke particles, as well as other impurities commonly found in the air, and bacteria that grow in water systems and on surfaces not cleaned regularly. Organic residues are chemical compounds containing carbon; for example, oils in fingerprints. Inorganic residues are chemical compounds not containing carbon; for example, hydrochloric acid or hydrofluoric acid which may be introduced from other steps in the wafer processing. As these examples indicate, the sources of contamination include materials which are omnipresent in the environment, such as carbon and oxygen, but also include other steps in the fabrication process, for example, chemical residue on RPCVD reactor walls or residual oxides from typical cleaning solvents such as peroxides.

One method for cleaning the wafer surface prior to epitaxial deposition processes is to employ a sequence of heated, peroxide-charged hydrochloric acid and ammonia hydroxide baths. Very harsh solvents can be used because the silicon surface is extremely resistant to almost all acids and bases. The silicon surface, however, will almost immediately react with and bind to impurities that are always present in the air and in aqueous solutions. By way of contrast, an oxygenated silicon surface (i.e. glass) is quite inert. Oxygen is therefore provided in the final step of the clean in order to form a glassy silicon oxide protective surface over the silicon surface. The silicon oxide protects the previously exposed silicon surface while the wafer is in transition from the cleaning area to the RPCVD reactor.

Prior to subsequent epitaxial deposition, the protective silicon oxide and any residual contaminants must be removed from the silicon surface. One common method is that the silicon oxide can be sublimated in-situ from the silicon surface in the RPCVD reactor by exposing the surface to a high temperature, approximately 900° C. or greater for a duration of approximately 5 minutes, in a hydrogen environment. Once a clean silicon surface has been established, epitaxy of the silicon-germanium layers can begin immediately. However, the processing temperature of these layers is considerably different than the temperature required for surface preparation. For example, fabrication of silicon-germanium layers is carried out at low temperatures, less than 700° C. During this temperature transition, which could require the wafer several minutes to cool and stabilize, the surface is at risk for possible recontamination from the reactor environment. For example, recontamination can originate from the RPCVD reactor quartz or by out diffusion of dopants from the silicon substrate. In addition, from a manufacturing perspective, the thermal cycling-required for a high-temperature cleaning regimen only adds to the total processing time, which slows the overall wafer throughput. Decreased wafer throughput is a further disadvantage of a high-temperature cleaning regimen.

One key disadvantage of a high-temperature cleaning regimen is the additional thermal budget when considering the integration of the silicon-germanium base region in the overall fabrication of the HBT. Increasingly, there is a driving force to reduce the thermal budget to minimize dopant diffusion, particularly for advanced CMOS generations. In the specific case of a silicon-germanium BiCMOS process, the fabrication of the HBT device must also meet the stringent requirements for thermal budget so as to not compromise CMOS electrical characteristics. One example where additional thermal budget impacts CMOS, i.e. the threshold voltage, is quite sensitive and can change as a result of the excess dopant diffusion. Therefore, it is important in silicon-germanium processing to maintain a low thermal budget, or to not introduce additional thermal budget.

Thus, there is need in the art to improve the thermal budget of methods used to clean and remove contaminants from silicon surfaces prior to epitaxial deposition of silicon-germanium. There is further need in the art to improve the yield for fabrication of silicon-germanium semiconductor devices by improving the methods used to clean and remove contaminants from the silicon surface prior to epitaxial deposition of silicon-germanium.

There is also need in the art to lower the operating temperature of the methods used to clean and remove contaminants from silicon surfaces prior to epitaxial deposition of silicon-germanium in order to prevent alteration or destruction of other CMOS structures on the same wafer. There is further need in the art to improve the throughput of methods used to clean and remove contaminants from silicon surfaces prior to epitaxial deposition of silicon-germanium by improving the thermal budget of the cleaning methods.

SUMMARY OF THE INVENTION

The present invention is directed to method for elimination of contaminants prior to epitaxy and related structure. The invention overcomes the need in the art to improve the thermal budget used to clean and remove contaminants from silicon surfaces prior to epitaxial deposition of silicon-germanium. The invention also improves the yield for fabrication of silicon-germanium semiconductor devices.

Further, the invention lowers the operating temperature used to clean and remove contaminants from the silicon surface prior to epitaxial deposition of silicon-germanium in order to prevent alteration or destruction of other CMOS structures on the same wafer. Moreover, the invention improves the throughput in cleaning and removing contaminants from the silicon surface prior to epitaxial deposition of silicon-germanium by improving the thermal budget.

According to the invention the surface of a semiconductor wafer is covered by a protective oxide. For example, the protective oxide can be silicon oxide and the semiconductor wafer can be a silicon wafer. The semiconductor wafer is then placed in a CVD reactor at a first temperature. For example, the first temperature can be approximately 650° C.

Contaminants and the protective oxide are then removed from the surface of the semiconductor wafer at the first temperature. For example, contaminants and the protective oxide can be removed from the surface of a silicon wafer by using an etchant, such as Hydrogen Chloride (HCl), and a precursor, such as Dichlorosilane ($SiH_2Cl_2$ or "DCS"), in appropriate proportions. While contaminants and the protective oxide are being removed by the action of HCl and DCS, any silicon being removed from the surface of the silicon wafer, is being replenished so that there is no net change in the amount of silicon on the surface of the wafer. After removal of the contaminants and the protective oxide, epitaxial growth is performed on the surface of the semiconductor wafer at the first temperature. For example, silicon germanium epitaxial growth can be performed on the surface of a silicon wafer.

Moreover, a structure comprising an epitaxially grown region can be fabricated according to the method of the invention discussed herein. For example, a silicon-germanium base region of a heterojunction bipolar transistor can be formed on a silicon surface prepared according to the method of the invention.

DETAILED DESCRIPTION OF THE INVENTION

The present invention is directed to method for elimination of contaminants prior to epitaxy and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
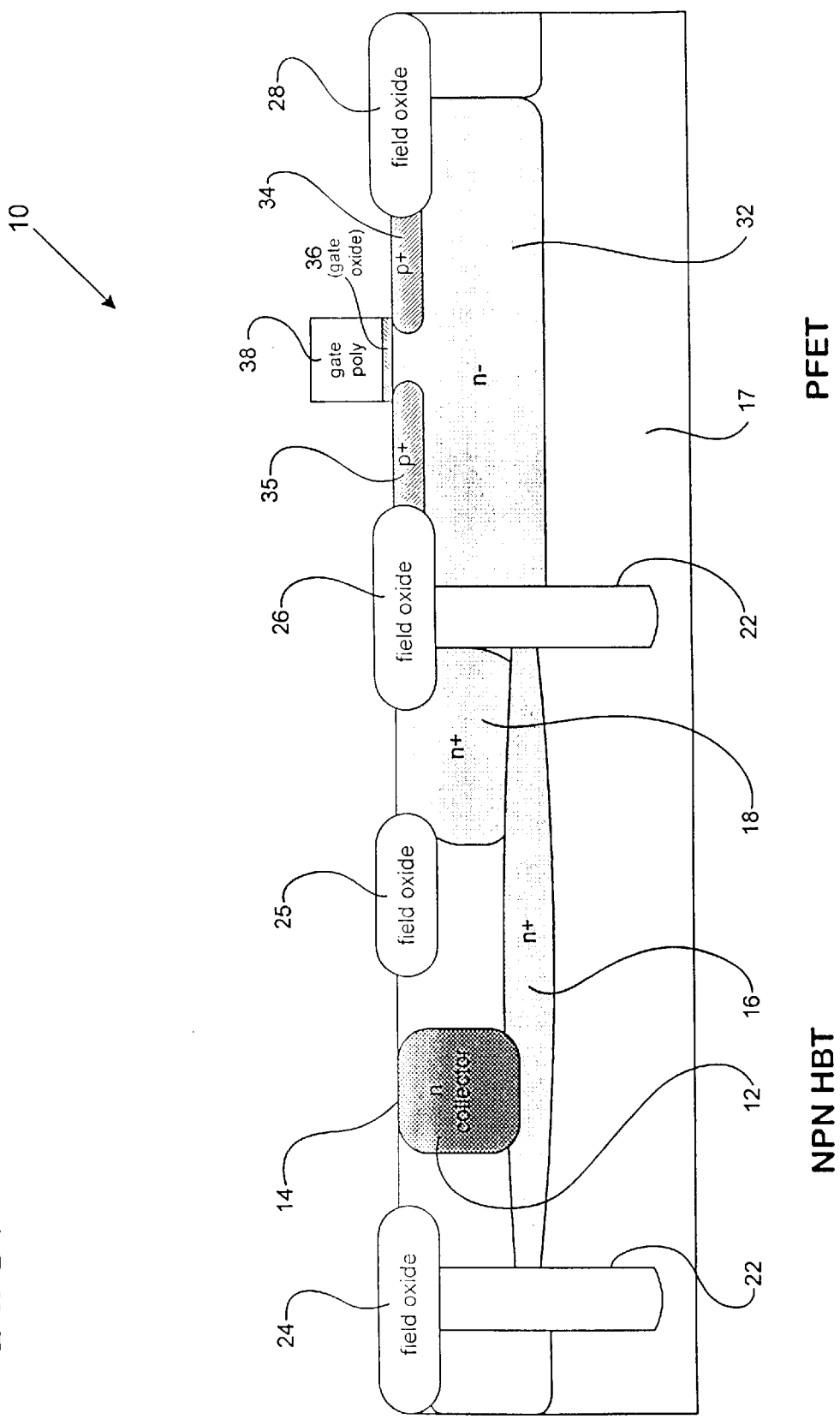
FIG. 1 illustrates a cross sectional view of some of the features of an NPN HBT and a PFET fabricated on the same wafer in accordance with one embodiment of the present invention.

FIG. 1 is shows exemplary structure 10 which is used to describe the present invention. Certain details and features have been left out of FIG. 1 which are apparent to a person of ordinary skill in the art. Structure 10 includes collector 12 for a silicon-germanium heterojunction bipolar transistor ("HBT"). Collector 12 is N-type single crystal silicon which can be formed using a dopant diffusion process in a manner known in the art. Collector 12 has a top surface 14. It is an object of one embodiment of the invention as described below to prepare top surface 14 for epitaxial deposition in an RPCVD process of a base comprised of P-type silicon-germanium single crystal on top surface 14. By the addition of base and emitter and formation of junctions and other structures in a manner known in the art, an NPN HBT is formed which includes collector 12.

As seen in FIG. 1, buried layer 16, which is composed of N+ type material—meaning that it is relatively heavily doped N-type material—is formed in silicon substrate 17 in a manner known in the art. Collector sinker 18, also composed of N+ type material, is formed by diffusion of heavily concentrated dopants from the surface of collector sinker 18 down to buried layer 16. Buried layer 16, along with collector sinker 18, provide a low resistance electrical pathway from collector 12 through buried layer 16 and collector sinker 18 to a collector contact (the collector contact is not shown in any of the Figures). Deep trench 22 structures and field oxide 24, 25, 26, and 28 structures composed of silicon oxide ($SiO_2$) material are formed in a manner known in the art. Deep trench 22 and field oxide 24, 25, 26, and 28 provide electrical isolation from other devices on silicon substrate 17 in a manner known in the art.

Continuing with structure 10 in FIG. 1, structure 10 includes features and components of other CMOS structures, such as a P-channel field effect transistor, or PFET, on the same wafer as NPN HBT. Structure 10 includes N well 32 for a PFET. N well 32 is N-type single crystal silicon which can be doped by ion implantation in a manner known in the art. Structure 10 further includes source 34 and drain 35 composed of P+ type material— meaning that it is relatively heavily doped P-type material— which also can be doped in a manner known in the art. Structure 10 also includes gate oxide 36, and gate polycrystalline silicon 38, both formed in a manner known in the art. By the addition of N well 32, source 34, drain 35, gate oxide 36, and gate polycrystalline silicon 38, a PFET is formed on the same wafer as NPN HBT.

Thus, FIG. 1 shows that structure 10 includes several features and components used to form an HBT between field oxide 24 and field oxide 26, while structure 10 simultaneously includes several CMOS features and components such as the PFET between field oxide 26 and field oxide 28. Thus, at the stage for which top surface 14 of collector 12 for an HBT is ready for epitaxy, several of the features and components for CMOS structures, such as N well 32, source 34, drain 35, gate oxide 36, and gate polycrystalline silicon 38 are present on the same wafer. Therefore, as stated above, it is imperative that further bipolar processing steps not cause undesirable changes in other CMOS structures on the same wafer. Moreover, it is desirable to eliminate high temperature processing steps for all the other reasons discussed above.

Figure 2:
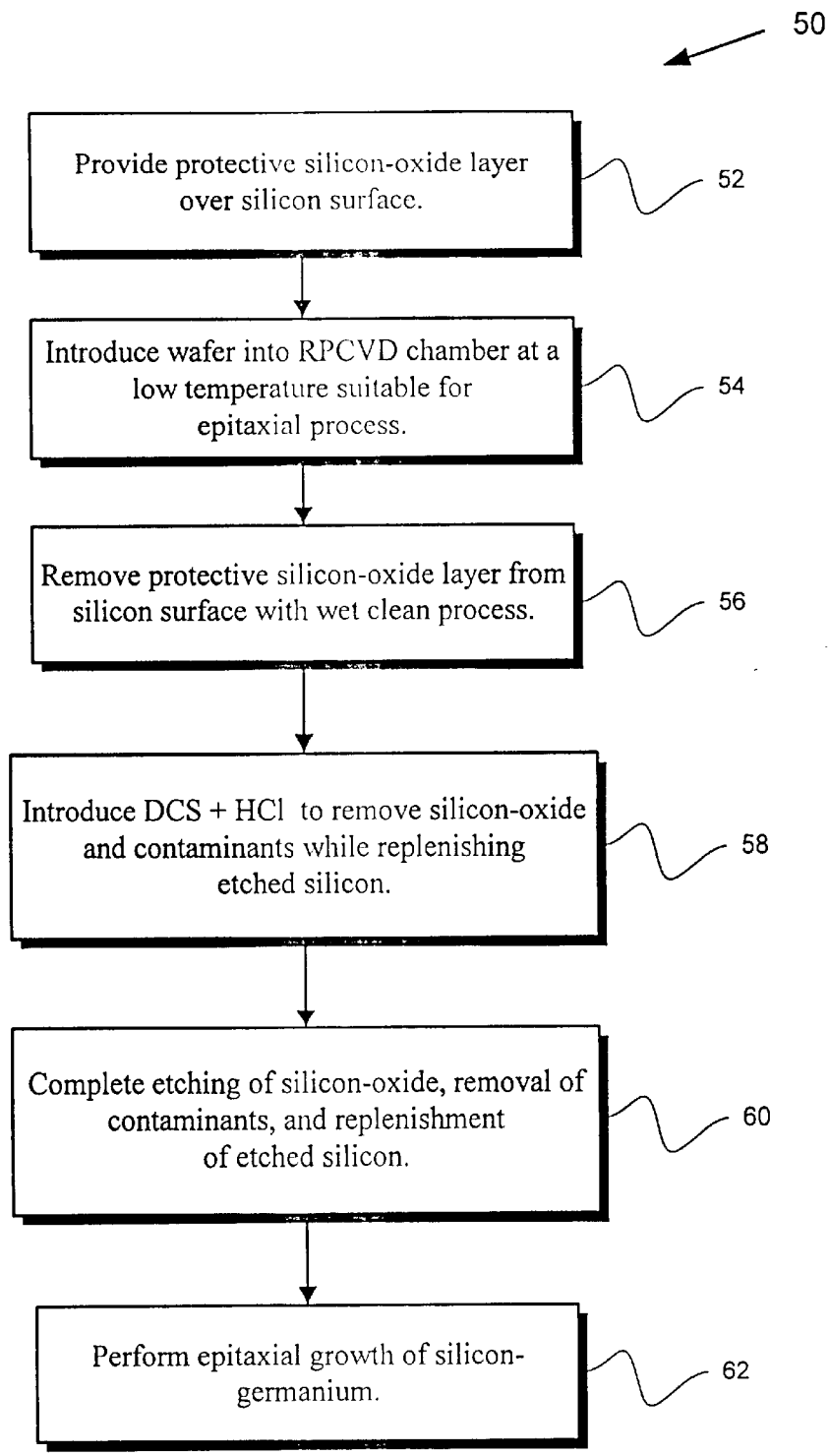
FIG. 2 shows a flowchart illustrating the steps taken to implement an embodiment of the present invention.

FIG. 2 shows flowchart 50 which describes the steps in processing a wafer which includes structure 10. Certain details and features have been left out of flowchart 50 which are apparent to a person of ordinary skill in the art, for example, a step may consist of one or more substeps or may involve specialized equipment, as known in the art.

Figure 3:
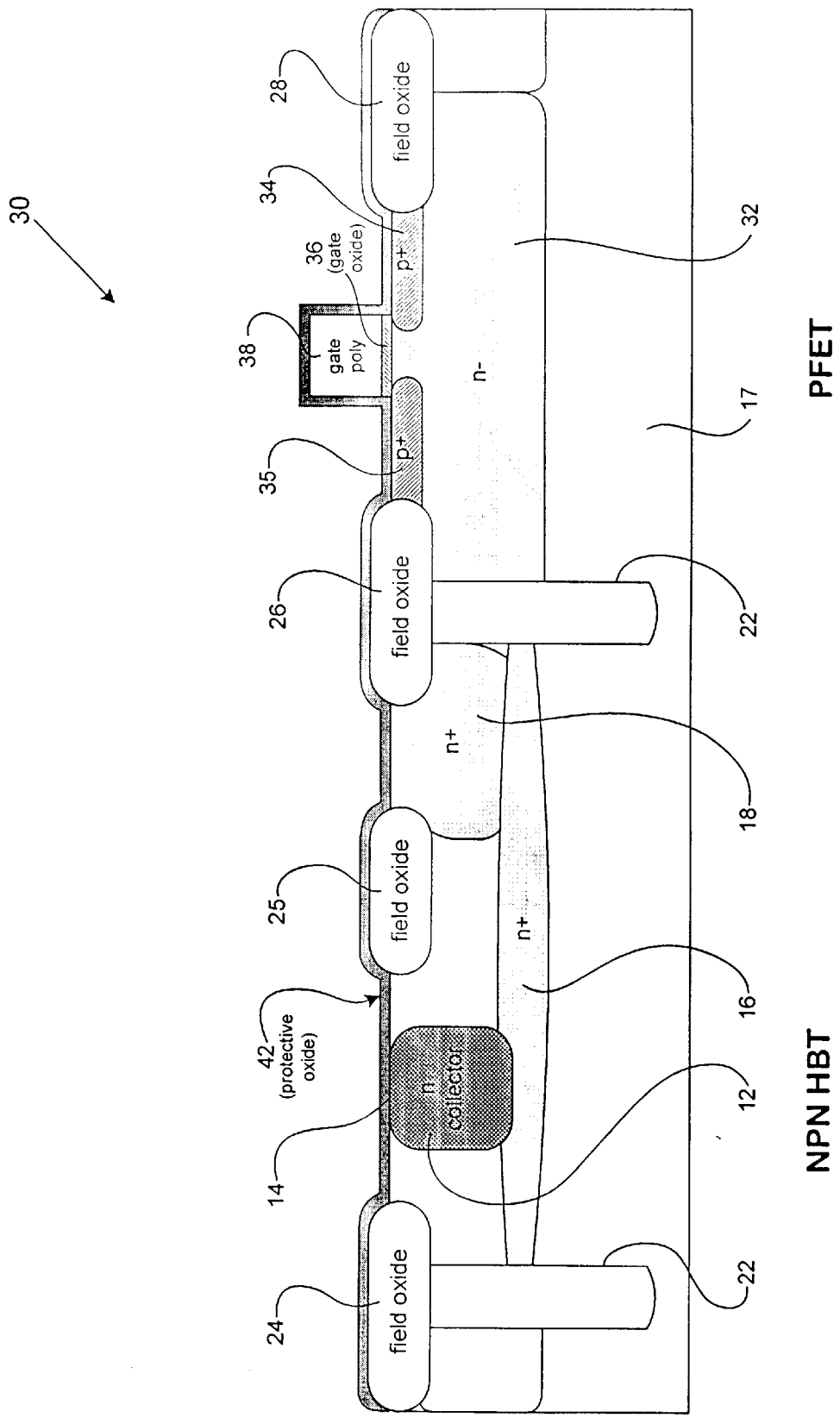
FIG. 3 illustrates a cross sectional view, similar to FIG. 1 but at a different stage in the fabrication process, of some of the features of an NPN HBT and a PFET fabricated on the same wafer in accordance with one embodiment of the present invention.

Steps 52 through 62 indicated in flowchart 50 are sufficient to describe one embodiment of the present invention, other embodiments of the invention may use steps different from those shown in flowchart 50. It is noted that the processing steps shown in flowchart 50 are performed on a wafer which, prior to step 52, includes structure 10 shown in FIG. 1. As discussed above, the exposed silicon surface of structure 10 is highly reactive, and it is, therefore, desirable to provide the surface of structure 10 with a protective silicon oxide layer to protect the surface of structure 10, including top surface 14 of collector 12, from contamination. Step 52 comprises providing a protective silicon oxide layer over the surface of structure 10 in a manner known in the art. Subsequent to step 52 then, structure 10 corresponds to the state shown in FIG. 3 which shows structure 10 of FIG. 1 after the addition of protective silicon oxide layer 42 in a manner known in the art. The remaining features and components shown in FIG. 3 are those shown in FIG. 1 with the same reference numbers to indicate the same features and components. FIG. 3 thus shows the entire top surface of structure 10 covered by protective silicon oxide layer 42.

Continuing with flowchart 50 in FIG. 2, subsequent to step 52, and beginning with step 54, structure 10 corresponds to the state shown in FIG. 3 with protective silicon oxide layer 42. Step 54 comprises introducing the wafer which includes structure 10 into an RPCVD reactor at a temperature suitable for epitaxial deposition process. The introduction and subsequent processing of the wafer which includes structure 10 at the epitaxial deposition temperature has advantages discussed further below.

Continuing with flowchart 50 in FIG. 2, step 54 is followed by step 56, which comprises removal of protective silicon oxide layer 42 in order to expose top surface 14 of collector 12. As discussed above, previously, removal of protective silicon oxide layer 42 was accomplished via the use of a high temperature hydrogen bake at approximately 900° C. for approximately 2.0 to 30.0 minutes. However, the removal of protective silicon oxide layer 42 according to step 56 is performed by replacing the high temperature hydrogen bake with a wet clean using hydrogen-fluoride, known as HF strip, to etch away most of protective silicon oxide layer 42. The HF strip can be accomplished at the epitaxial deposition temperature, which in one embodiment of the invention is approximately 650° C. Thus, one embodiment of the invention reduces thermal budget by eliminating transition to the high temperature of approximately 900° C. and subsequent transition back to the epitaxial deposition temperature of approximately 650° C. The embodiment of the invention described here also decreases the risk of damage to the CMOS attendant with high temperature processing steps by eliminating the high temperature hydrogen bake and also improves throughput by eliminating time periods associated with transitions between the high temperature of the hydrogen bake and the lower epitaxial deposition temperature.

Subsequent to step 56, not all of the silicon oxide protective layer has been removed. There is a residual amount of silicon oxide and possibly other contaminants left on the surface of the wafer which includes structure 10. The residual contaminants must be removed in order to assure successful crystal growth by epitaxial deposition. Step 56 is, therefore, followed in flowchart 50 by step 58, which comprises introduction of dichlorosilane ("DCS") and hydrogen-chloride ("HCl") into the RPCVD reactor. The HCl acts as an etchant to remove the residual silicon oxide and other residual contaminants. The DCS acts as a precursor for deposition of silicon to replace silicon which may be etched away by the HCl. The reactions comprising etching and deposition using DCS and HCl take place at the relatively low epitaxial deposition temperature. In other words, there is no need for the high temperature bake process for removing the residual silicon oxide and other residual contaminants. Thus, the embodiment of the invention described here has the advantages, discussed above, associated with reducing thermal budget by eliminating high temperature transitions.

Figure 4:
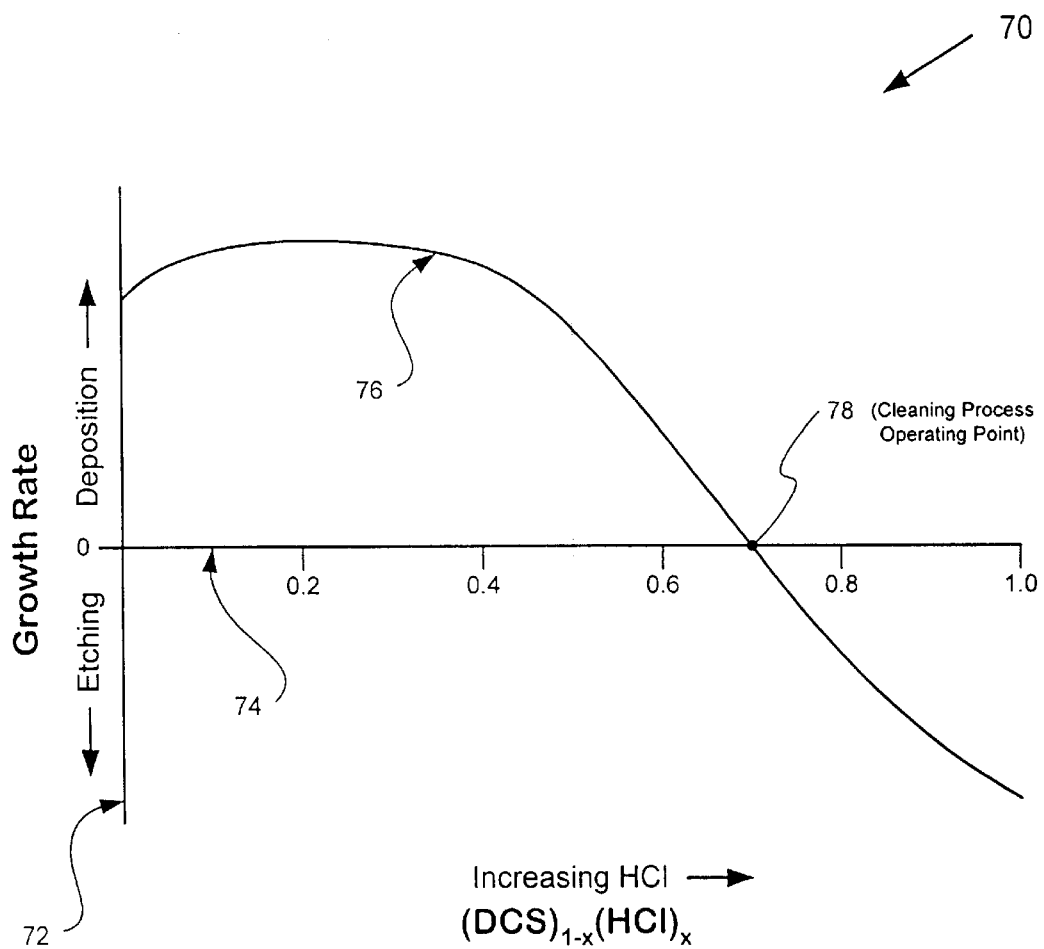
FIG. 4 illustrates silicon growth rates as a function of relative concentrations of Dichlorosilane ($SiH_2Cl_2$) and Hydrogen Chloride (HCl) for a typical CVD process.

Graph 70 of FIG. 4 shows the relationship of etching versus deposition for DCS and HCl. Graph 70 includes silicon growth rare axis 72, in microns per minute. It is noted that deposition increases in the positive direction away from the origin of graph 70 and that etching increases in the negative direction away from the origin of graph 70. Silicon growth rate axis 72 is plotted against chemistry axis 74, measured as a relative fraction of the amounts of DCS and HCl present in the RPCVD reactor. It is noted that the relative amount of HCl present increases (while the relative amount of DCS simultaneously decreases) in the direction away from the origin of graph 70. It is also noted that the amount of DCS present increases (while the relative amount of HCl simultaneously decreases) in the direction toward the origin of graph 70.

Graph 70 describes silicon growth rate as a function of the relative amounts of DCS and HCl present in the RPCVD reactor at temperature and pressure suitable for the RPCVD process. Graphs similar to graph 70 for depicting silicon growth versus the HCl and DCS chemistry are obtained for other types of CVD processes, such as the rapid thermal CVD ("RTCVD"). However, specific numerical values for the growth rate on silicon growth rate axis 72 and for chemistry axis 74 might be different for different types of CVD processes. Therefore, graph 70 is intended for use as a general guide to illustrate the concepts and, as such, no specific numerical values have been indicated in graph 70.

The chemistry of step 58 is based on the two chemical reactions:

$SiH_2Cl_2 \leftrightarrows Si + 2HCl$. The double arrow indicates that the reactions are reversible; the reaction in one direction deposits or replaces silicon atoms and the reaction in the other direction etches or removes silicon. Graph 70 shows the effect of the two reactions. Silicon growth rate curve 76 shows that as the relative proportion of HCl increases, the deposition rate first increases, then reaches a maximum, and then begins to decrease as the etching reaction starts to dominate. In one embodiment of the invention, the operating point is where deposition and etching are balanced. This balanced operating point is shown in graph 70 as "cleaning process operating point" 78. The cleaning process of step 58 etches away substantially all contaminants while simultaneously replacing silicon etched away from the top surface of structure 10 including top surface 14 of collector 12. Thus, there is substantially no net change in the amount of silicon in the top surface of structure 10 during the cleaning process of step 210.

Continuing with flowchart 50 in FIG. 2, step 58 is followed by step 60, which represents completion of the cleaning process of step 58. At the completion of the cleaning process of step 58 the top surface of structure 10 is clean and, in particular, top surface 14 of collector 12 is ready for epitaxial deposition of single crystal silicon-germanium base of the NPN HBT.

Continuing with flowchart 50 in FIG. 2, step 60 is followed by final step 62, which comprises epitaxial deposition, in an RPCVD process, of single crystal silicon-germanium base of the NPN HBT. As discussed above, the higher gain, speeds, and frequency response of the HBT have been achieved as a result of certain advantages of silicon-germanium not available with pure silicon. For example, the higher speeds and frequency response of the HBT have been achieved as a result of taking advantage of the narrow band gap for silicon-germanium. The energy band gap of silicon-germanium is smaller than it is for silicon, lying between the intrinsic band gap of silicon (1.12 eV) and germanium (0.66 eV). The band gap is reduced further by the "compressive strain" in the silicon-germanium alloy layer, with the band gap being reduced even further with increasing germanium content.

The benefits of compressive strain in the alloy layer can be destroyed, however, by relaxation of the strain due to crystal dislocations. Crystal dislocations in the alloy layer can be caused by imperfections in the underlying silicon crystal layer or by the presence of contaminants on the underlying silicon crystal layer. The prevention of crystal dislocations is aided by special techniques in the epitaxial deposition of silicon-germanium, for example, a silicon seed layer is placed on top of collector 12 to maintain good crystallinity to aid growth of silicon-germanium above collector 12. The effectiveness of the seed layer technique is negated by the presence of contaminants.

Therefore, although silicon-germanium may be epitaxially grown on silicon wafers using conventional silicon processing and tools, the added considerations imposed by, for example, maintaining strain in the alloy layer and the use of special techniques in silicon-germanium epitaxy increase the demand for removal of contaminants prior to silicon-germanium crystal growth by epitaxial deposition. According to the present embodiment of the invention, the yield of the semiconductor wafer is significantly increased due to the effectiveness of the invention's cleaning process described above.

It is appreciated by the above detailed disclosure that the invention provides a method for elimination of contaminants prior to epitaxial growth. Although the invention is described as applied to the construction of a heterojunction bipolar transistor, it will be readily apparent to a person of ordinary skill in the art how to apply the invention in similar situations where preparation is needed for single crystal silicon-germanium growth or even a single crystal silicon growth.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for elimination of contaminants prior to epitaxy and related structure have been described.

What is claimed is:

1. A structure comprising:
   a silicon-germanium region in a silicon wafer, said silicon-germanium region having been formed by a method comprising steps of:
   covering a surface of said silicon wafer with a protective oxide;
   placing said silicon wafer in a CVD reactor at a first temperature;
   supplying a first amount of an etchant in said CVD reactor;
   supplying a second amount of a precursor in said CVD reactor;
   removing, by said etchant, contaminants and said protective oxide from said surface of said silicon wafer;
   replenishing, by said precursor, silicon etched from said surface of said silicon wafer;
   performing, at said first temperature, an epitaxial growth of silicon-germanium to form said silicon-germanium region in said silicon wafer.

2. The structure of claim 1 wherein said silicon-germanium is a base region in a heterojunction bipolar transistor.

3. The structure of claim 1 wherein said protective oxide is silicon oxide.

4. The structure of claim 1 wherein said CVD reactor is an RPCDV reactor.

5. The structure of claim 1 wherein said first temperature is approximately 650° C.

6. The structure of claim 1 wherein said etchant comprises hydrogen chloride.

7. The structure of claim 1 wherein said precursor comprises dichlorosilane.

8. A structure comprising:
   a region in a semiconductor wafer having a top surface, said top surface having been prepared by a method comprising steps of:
   using an etchant at a first temperature to remove contaminants from said top surface;
   using a precursor at said first temperature to replenish semiconductor etched from said surface by said etchant; and
   depositing, at said first temperature, a layer of silicon-germanium over said top surface of said semiconductor wafer.

9. The structure of claim 8 wherein said layer of silicon-germanium is a base region in a heterojunction bipolar transistor.

10. The structure of claim 9 further comprising a collector region, said collector region forming a junction with said base region at said top surface.

11. The structure of claim 8 wherein said etchant is hydrogen chloride.

12. The structure of claim 8 wherein said precursor is dichlorosilane.

13. The structure of claim 8 wherein said first temperature is approximately 650° C.

14. The structure of claim 8 wherein said top surface is prepared in a CVD reactor.

15. The structure of claim 14 wherein said layer of silicon-germanium is epitaxially deposited in said CVD reactor.

16. A structure comprising:
    a collector region;
    a top surface of said collector region, said top surface having etched regions;
    replenished silicon grown in said etched regions of said collector region;
    a base region situated over said collector region and forming a junction with said collector region at said top surface.

17. The structure of claim 16 wherein said etched regions are formed by an etchant used for cleaning said top surface.

18. The structure of claim 17 wherein said etchant is hydrogen chloride.

19. The structure of claim 16 wherein said replenished silicon is grown from a precursor.

20. The structure of claim 19 wherein said precursor is dichlorosilane.

21. The structure of claim 16 wherein said etched regions are formed and wherein said replenished silicon is grown at a first temperature.

22. The structure of claim 21 wherein said first temperature is approximately 650° C.

23. The structure of claim 21 wherein said base is deposited over said collector at said first temperature.

24. The structure of claim 16 wherein said base comprises silicon-germanium.

* * * * *